United States Patent [19]
Swart

[11] Patent Number: 6,051,978
[45] Date of Patent: Apr. 18, 2000

[54] TDR TESTER FOR X-Y PROBER

[75] Inventor: Mark A. Swart, Anaheim Hills, Calif.

[73] Assignee: Delaware Capital Formation, Inc., Wilmington, Del.

[21] Appl. No.: 09/066,962

[22] Filed: Apr. 27, 1998

[51] Int. Cl.[7] ............................. G01R 31/02; G01R 31/11
[52] U.S. Cl. ........................... 324/537; 324/533; 324/754
[58] Field of Search ..................................... 324/532, 533, 324/534, 535, 537, 754

[56] References Cited

U.S. PATENT DOCUMENTS

| | | | |
|---|---|---|---|
| 4,565,966 | 1/1986 | Burr et al. | 324/754 |
| 5,006,808 | 4/1991 | Watts | 324/537 |
| 5,744,964 | 4/1998 | Sudo et al. | 324/537 |

*Primary Examiner*—Glenn W. Brown
*Attorney, Agent, or Firm*—Christie, Parker & Hale, LLP

[57] ABSTRACT

A printed circuit board tester for testing matched impedance test sites on a printed circuit board comprising an x-y prober having a first prober head and a second prober head above the printed circuit board connected to a time domain reflectometer by a coaxial test cable. A signal probe is attached to one of the prober heads. The test cable includes a signal wire which is electrically connected to the signal probe and includes a ground shield electrically connected to a ground shield extender positioned around the signal probe. A separate ground probe is connected to the second prober head and includes a ground spring for temporarily contacting the ground shield extender to transmit ground signals to the ground shield of the test cable.

22 Claims, 11 Drawing Sheets

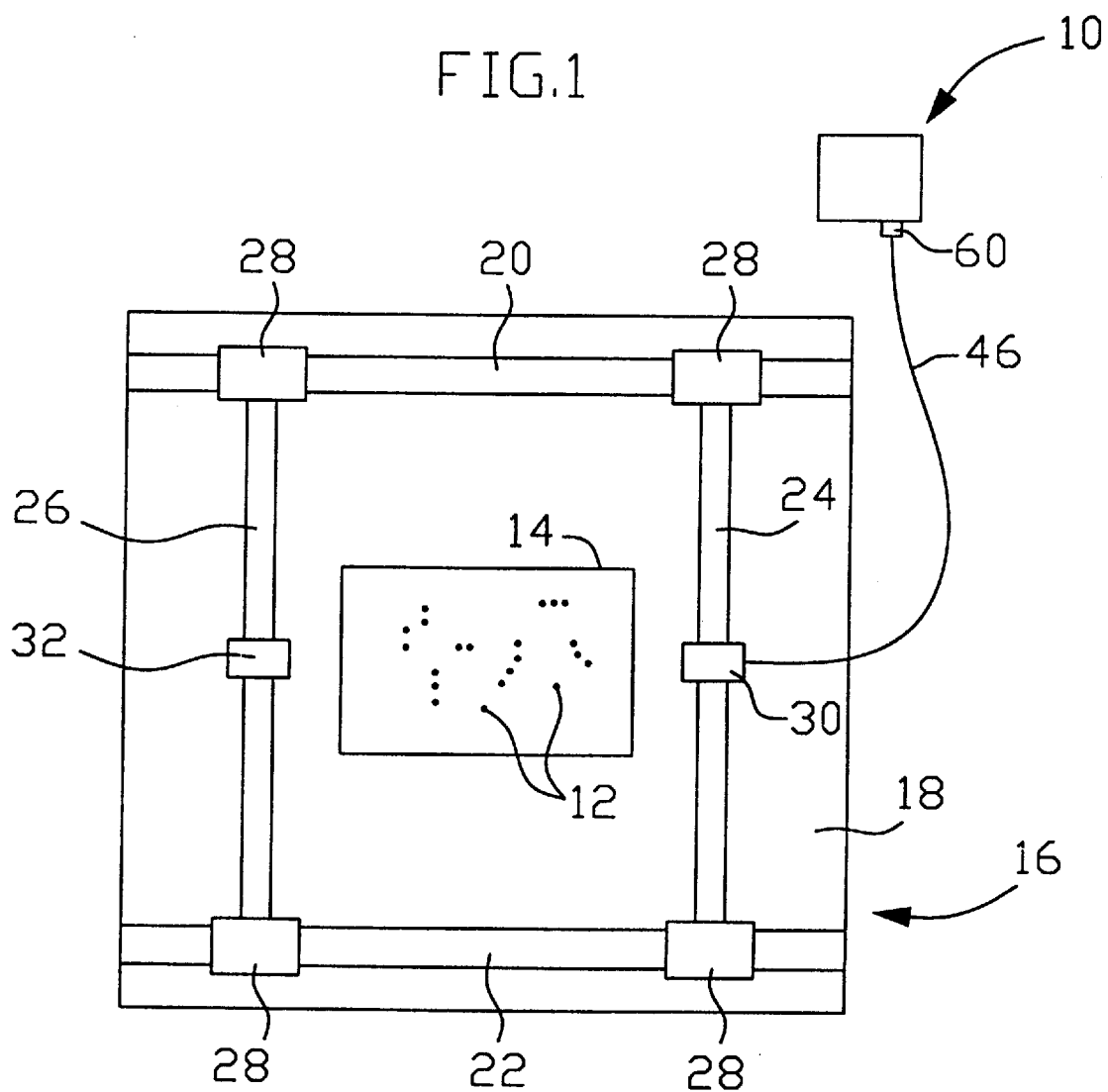

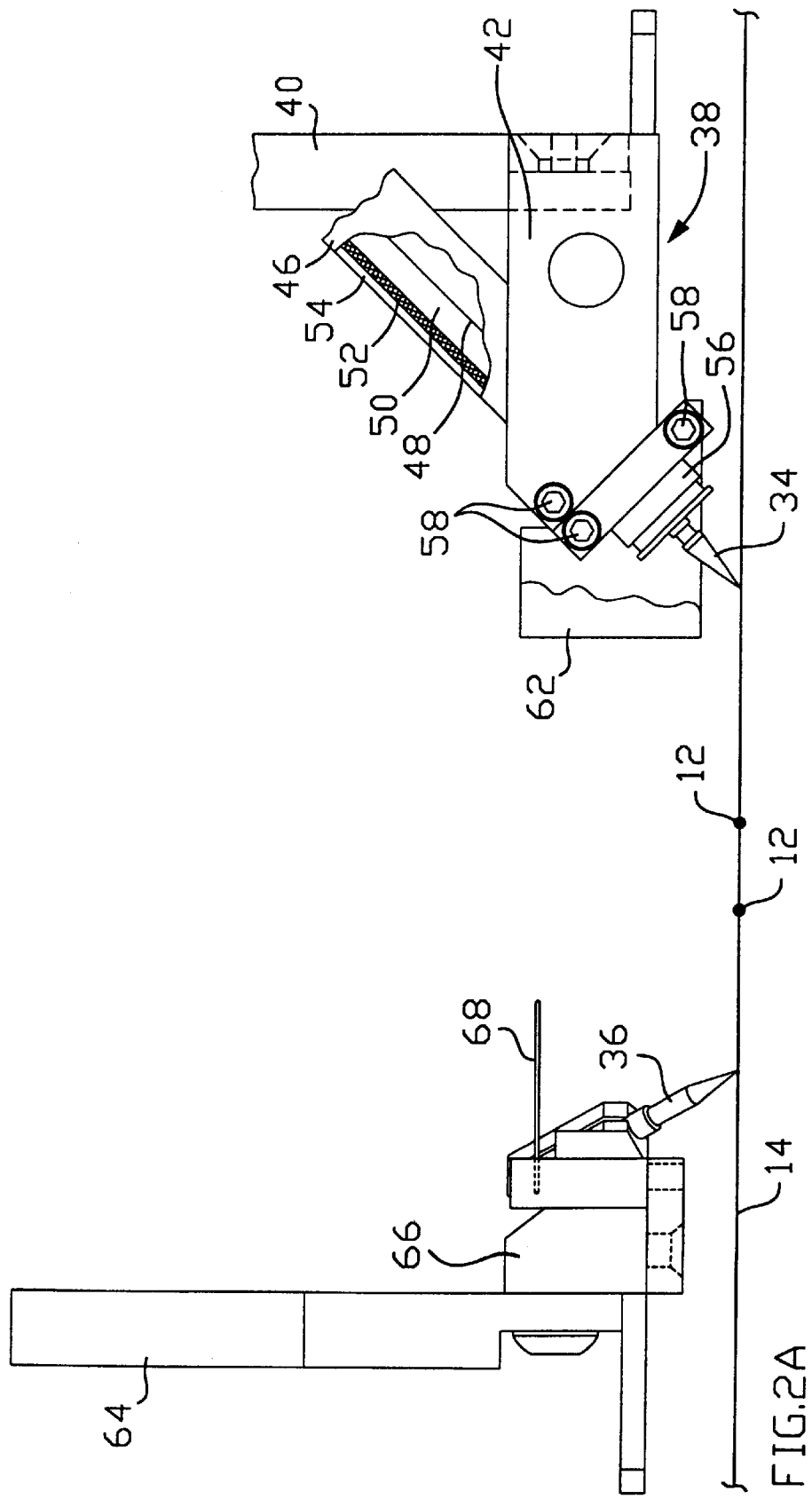

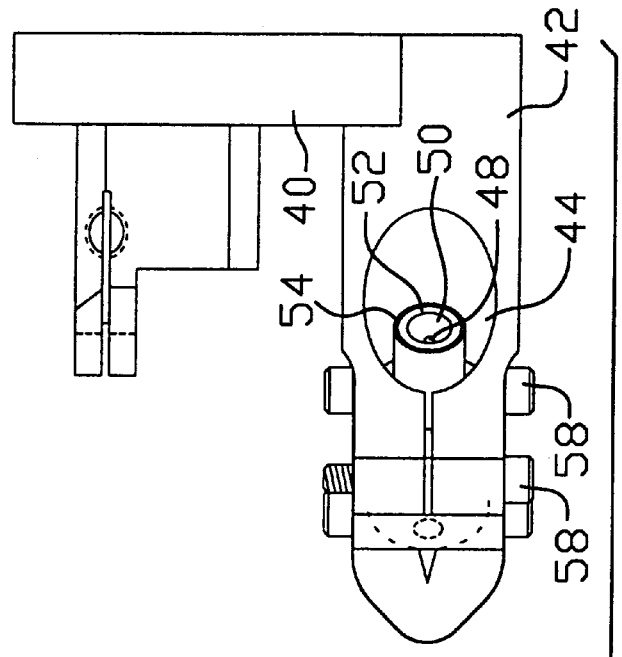
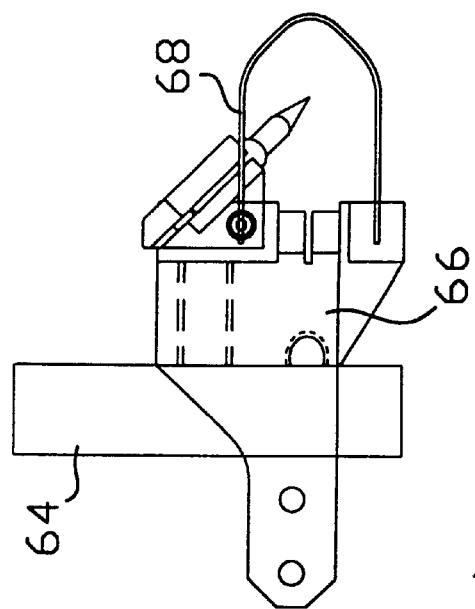
FIG.2B

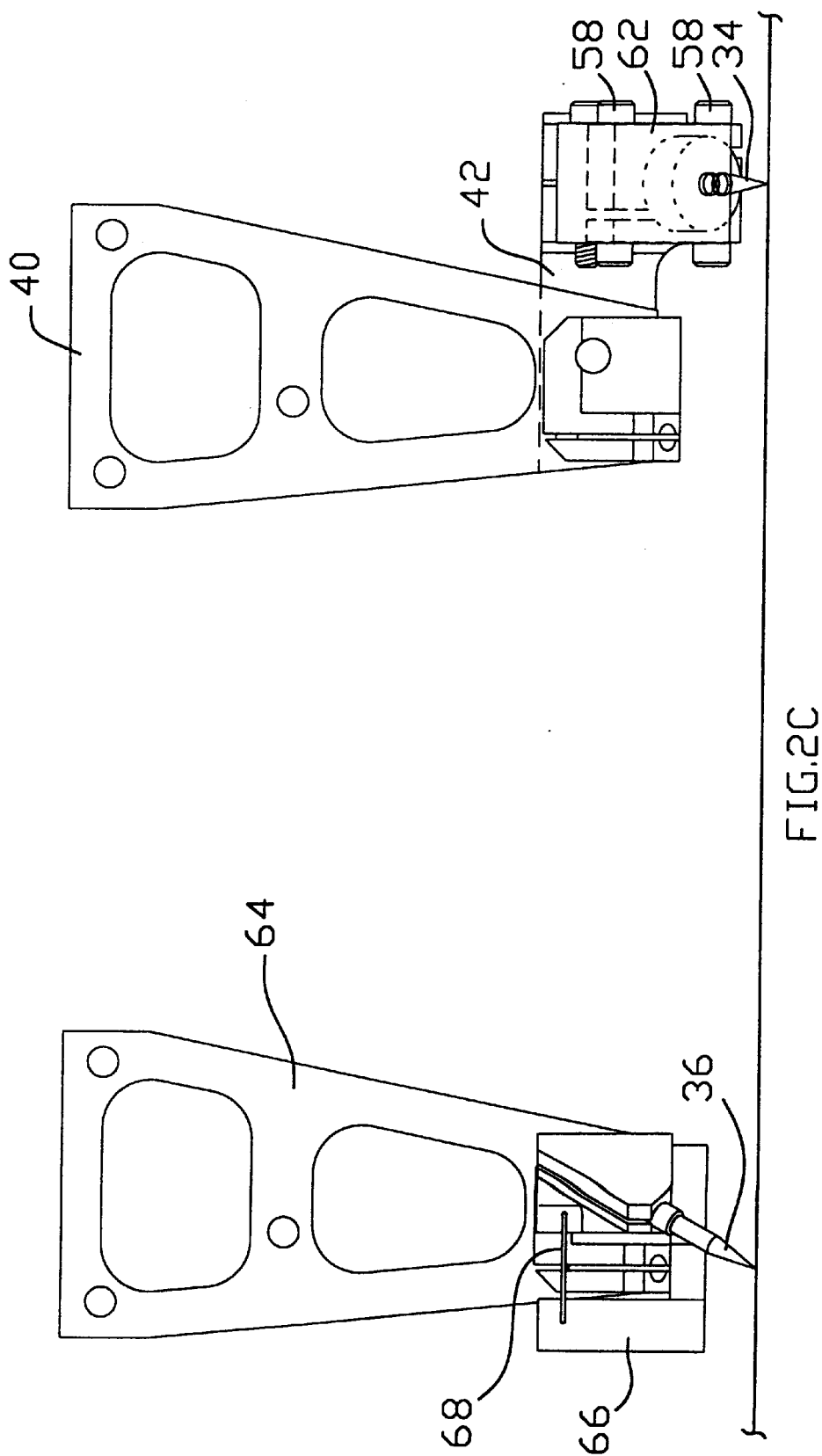

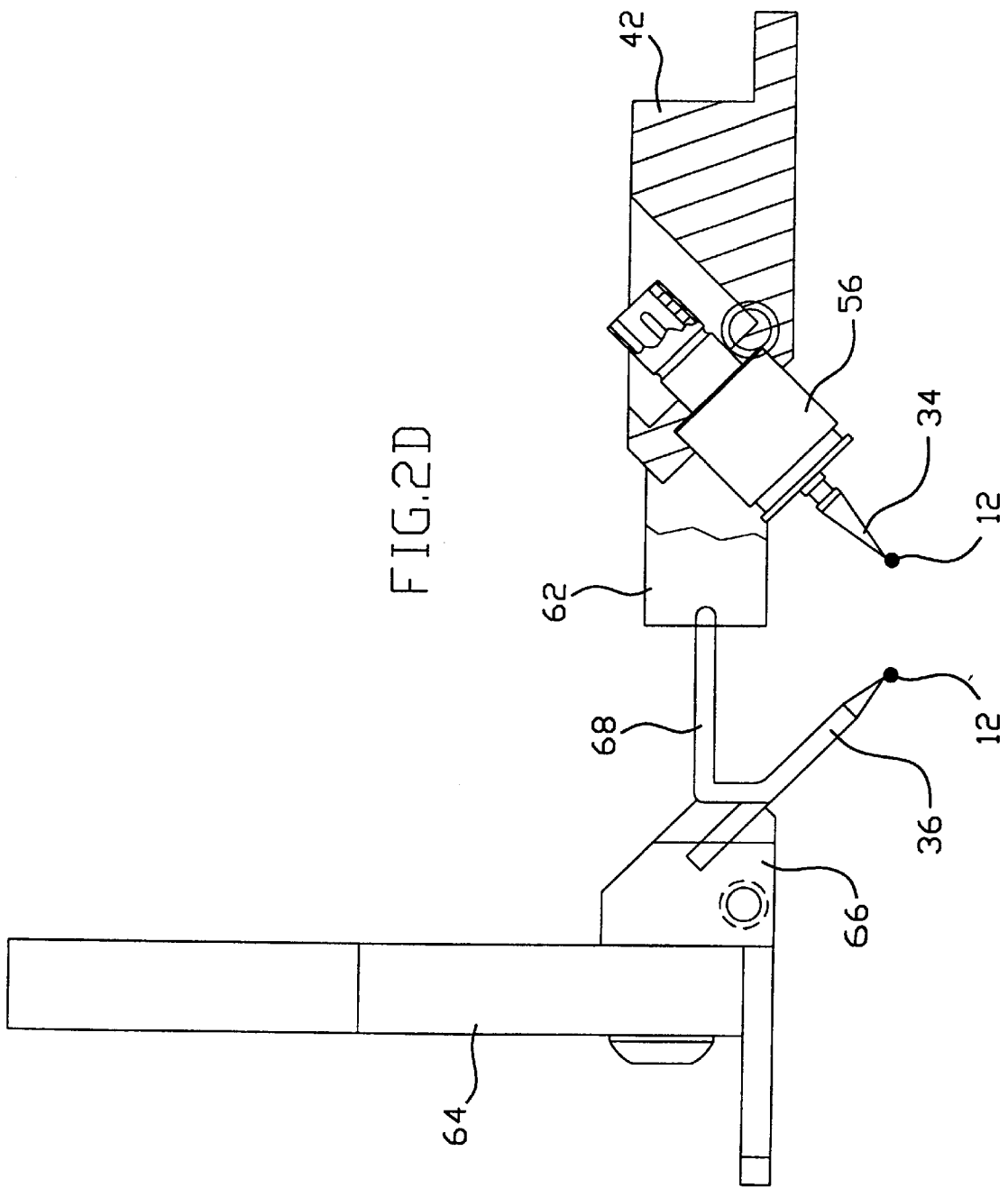

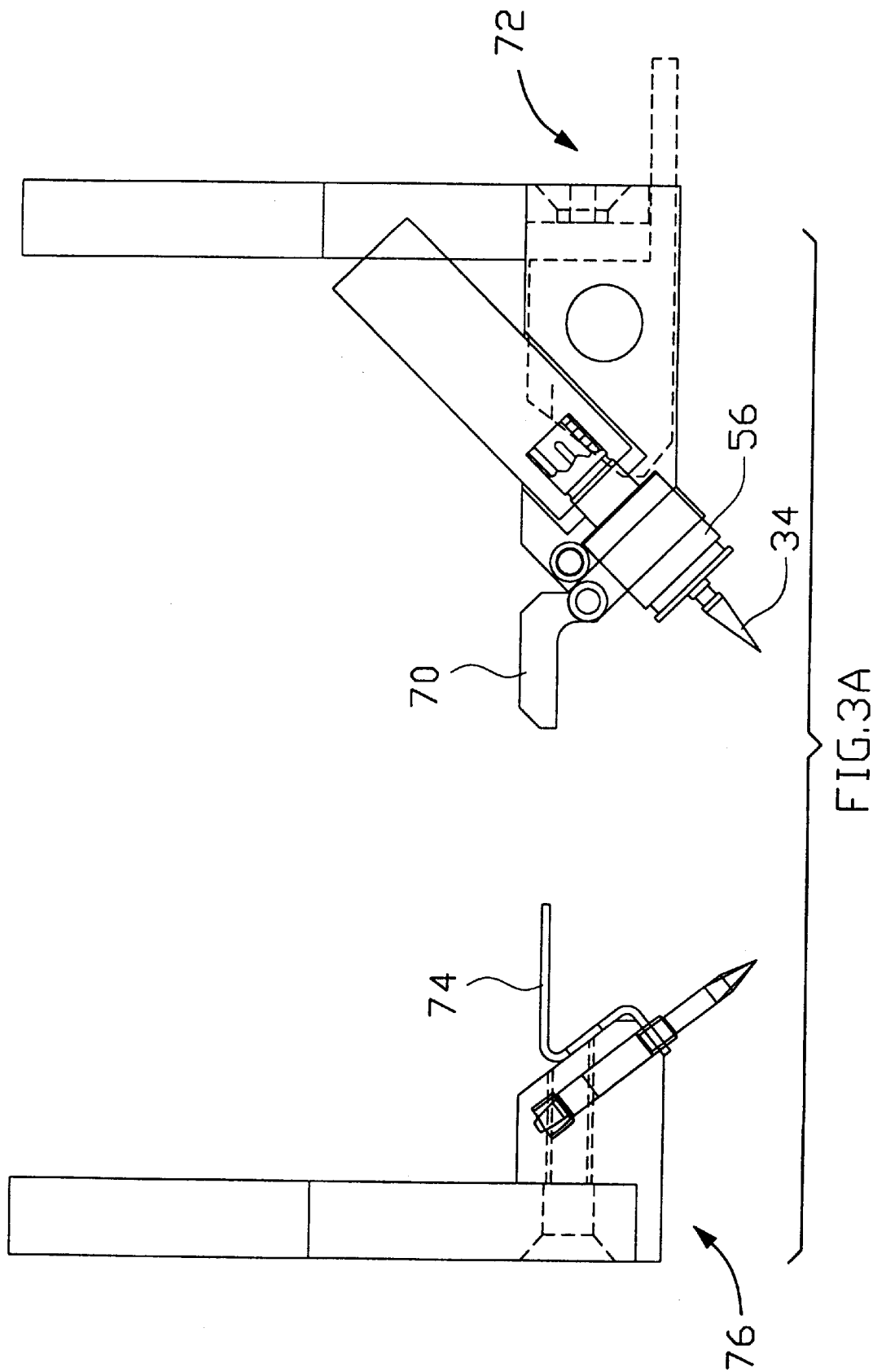

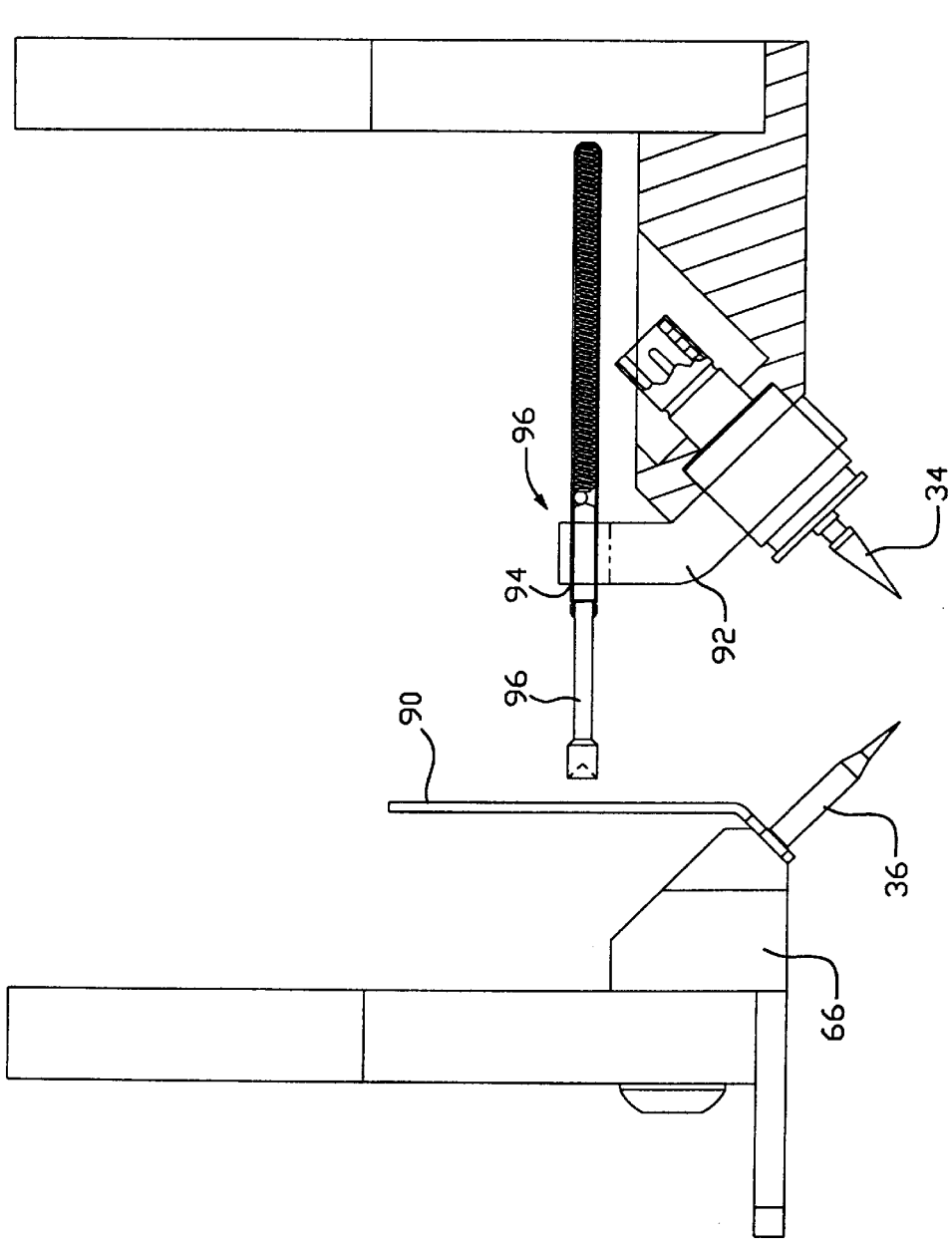

TDR TESTER FOR X-Y PROBER

BACKGROUND OF THE INVENTION

The present invention relates to testing of electrical circuits, and more specifically to testing of matched impedance test points on a circuit board by a time domain reflectometer (TDR) through an x-y prober.

Testing match impedance test points on a circuit board requires contacting the test points by test probes and analyzing the test signals with a time domain reflectometer. Previous TDR technology consisted of separate hand held probes consisting of a signal probe and a ground probe which were manually operated to contact the desired test locations. When multiple test locations exist for testing, manually testing each site is an inefficient and time consuming task. Consequently, more automated TDR configurations were developed consisting of an x-y prober wherein only one of the prober heads was used and was modified such that the signal wire and the ground shield of the TDR cable extended to the tip of one of the heads of the x-y prober. This single head was designed to be adjustable and rotatable for different test pad spacings. Incorporating a rotatable and adjustable tip on a single prober head is a very expensive and complicated device for testing matched impedance test points. Consequently, a need exists for an automated TDR tester capable of testing matched impedance test points that addresses the problems of the prior art and is easy and inexpensive to manufacture.

SUMMARY OF THE INVENTION

The present invention is a TDR tester which eliminates the need for a rotatable and width adjustable head on a prober. The invention includes an x-y prober which normally has two prober heads, both movable in the x, y and z directions. A coaxial test cable having a signal wire and a ground shield is connected to a first prober head. A signal probe is electrically connected to the coaxial cable through a connector whereby the signal probe is electrically connected to the signal wire of the coaxial cable. A ground shield extender is positioned around the connector for the signal probe and is electrically connected to the ground shield of the coaxial cable. The signal probe assembly is attached to the first prober head by a bracket assembly. A ground probe is connected to a second prober head through a bracket arrangement. A ground spring is electrically connected to the ground probe. In operation, the prober heads move the signal probe and the ground probe into contact with the desired test sites so that the ground shield extender of the signal probe assembly comes into contact with the ground spring of the ground probe so that the test signals from the test sites are electrically transferred through the coaxial cable to the test analyzer. The x-y prober heads are programmed to move to the various locations automatically as necessary to test the desired test locations.

These and are other aspects of the invention will be more fully understood by referring to the following detailed description and the accompanying drawings.

BRIEF DESCRIPTION OF THE DRAWINGS

FIG. 1 is a schematic top view of an x-y prober of the present invention;

FIG. 2A is a front view of a signal probe and ground probe arrangement as attached to the prober heads of the prober of FIG. 1;

FIG. 2B is a top view of the signal probe and ground probe arrangements of FIG. 2A;

FIG. 2C is a side view of the signal probe and ground probe arrangements of FIG. 2A;

FIG. 2D is a front view of a first alternative embodiment of a signal probe and a ground probe of FIG. 2A wherein the ground probe is integrally formed with the ground spring;

FIG. 3A is a front view of a second alternative embodiment of the signal probe and ground probe arrangement of the present invention;

FIG. 6 is a front view of a fifth alternative embodiment of the spring probe and ground probe arrangement of the present invention.

DETAILED DESCRIPTION

Figure 3B:
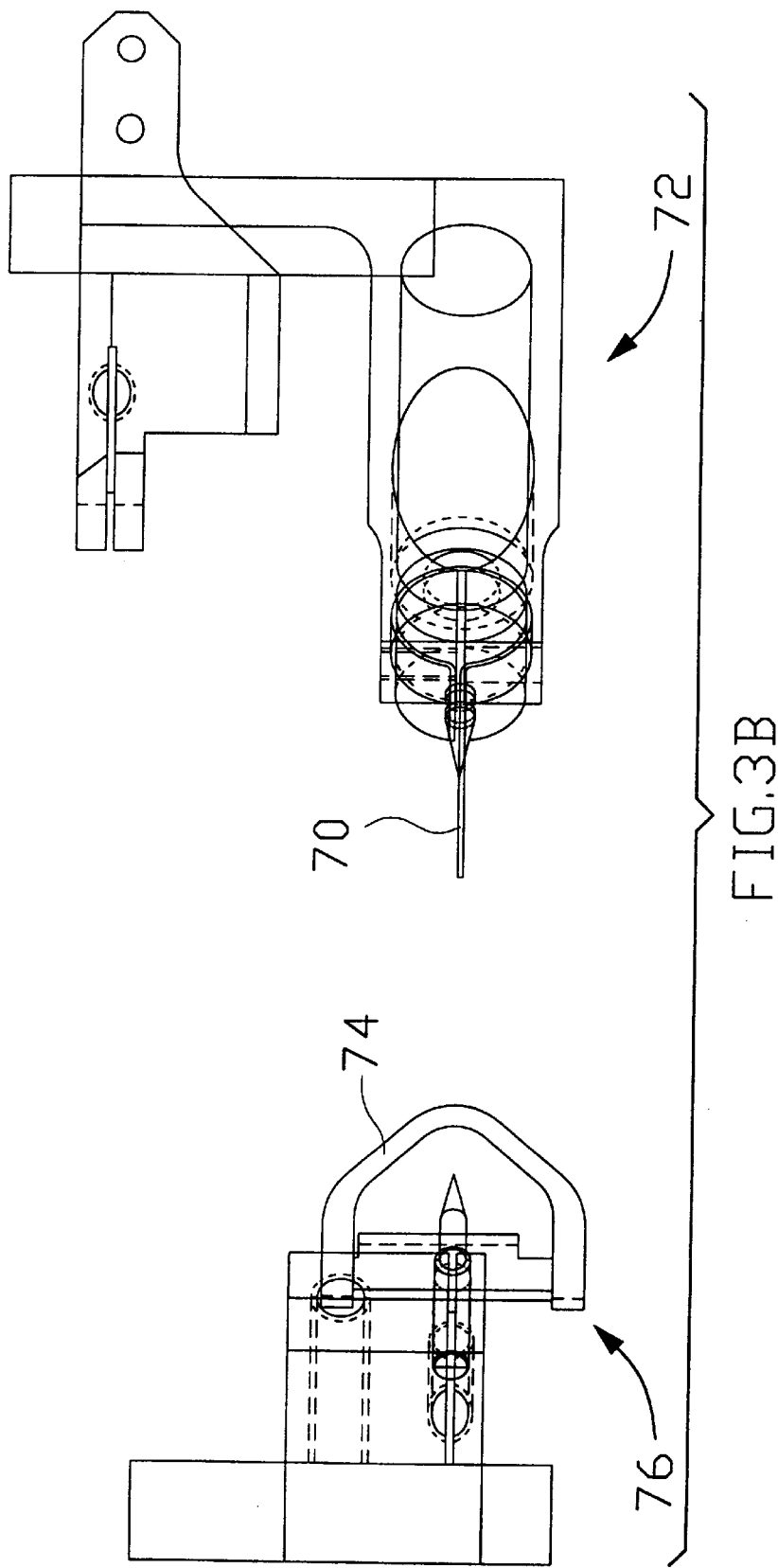
FIG. 3B is a top view of the signal probe and ground probe of FIG. 3A.

As shown in FIG. 1 the present invention is directed a TDR tester 10 for testing matched impedance test sites 12 on a printed circuit board 14 through the use of an x-y prober 16. Prober 16 includes a mounting platform 18 upon which the printed circuit board is mounted for testing. The prober further includes an upper x-arm 20 and a lower x-arm 22 which are attached in a stationary position and slightly above the prober platform 18. The prober further has a first y-arm 24 and a second y-arm 26 connected to the upper and lower x-arms by slides 28. The y-arms are movable in x-direction along the x-arms, as is conventional for an x-y prober. A first prober head 30 is movably positioned on the first y-arm 24 and a second prober head 32 is movably positioned on the second y-arm 26. Prober heads 30, 32 are movable along the y prober arms in the y-direction. The combination of the movement of the y prober arms in the x-direction and the prober heads along the y-arm in the y-direction allows for the prober heads to be positioned adjacent to any two test sites 12 to be tested. Prober heads 30, 32 are also movable in the z-direction by a selenoid or linear motor as is conventional for an x-y prober.

The present invention eliminates the need for a rotatable and width adjustable head on the prober by utilizing both prober heads 30, 32 for testing the desired test sites 12. As shown in FIGS. 2A through 2C the test sites 12 are contacted by a signal probe 34 and a ground probe 36. Signal probe 34 is attached to prober head 30 by a signal probe assembly 38. Signal probe assembly 38 comprises a bracket 40 mechanically fastened to the prober head 30 and extending downwardly toward the prober platform 18. Located at the bottom of the bracket 40 is a signal probe housing 42 having an angled bore 44 for insertion of the signal probe 34 and the test cable 46. The test cable is a coaxial cable 46 which includes a signal wire 48, a dielectric 50 around the signal wire, a ground shield 52 around the dielectric and an insulating sheath 54 around the ground shield. The signal probe 34 is electrically connected to the signal wire 48 by a connector 56 located at the end of the test cable adjacent the signal probe. The signal probe and the test cable are connected to the signal probe housing by clamping the connector within the bore 44 by bolts 58. The test cable extends outwardly away from the x-y prober and is electrically connected to the TDR by a connector 60 as shown in FIG. 1. A ground shield extender 62 or bumper bar is positioned around the signal probe 34 and connected to the outer surface of the signal probe housing 42 by bolts 58. The function of the ground shield extender 62 will be discussed in more detail subsequently.

The ground probe 36 is connected to the second prober head 32 by a bracket 64 extending downwardly from the prober head towards the prober platform 18. The ground probe 36 is connected to the bracket 64 by a ground probe housing 66 located at the end of the bracket 64. A ground spring 68 is electrically connected to the ground probe 36 and is rigidly connected to the ground probe housing 66 so that it can extend outwardly toward the signal probe assembly. The ground spring in this embodiment is a flexible wire and the ground shield extender is a flexible metal band so that when the signal probe and the ground probe are moved into contact with the desired test location the ground spring and the ground shield extender are flexible to compensate for various different spacings between desired test sites. Therefore in use, as the signal probe is moved into contact with a test site and the ground probe is moved into contact with a test site the ground spring and the ground shield extender will come into contact with one another. The test signal from the signal probe is sent through the signal wire to the TDR and the ground signal from the ground probe is sent through the ground spring into the ground shield extender and into the ground shield of the test cable to the TDR tester for analysis.

FIG. 2D illustrates the ground spring 68 in contact with the ground shield extender 62 when the signal probe 34 and the ground probe 36 are in contact with test sites 12. It further should be noted that in FIG. 2D the ground spring 68 can be formed integrally with ground probe 36 and be an extension from the ground probe rather than be a separate wire fastened to the ground probe housing 66.

FIGS. 3A and 3B show a second alternative embodiment for the ground shield extender 70 on the signal probe assembly 72 and the ground spring 74 connected to the ground probe assembly 76. In this embodiment the ground shield extender is a metal band positioned around the signal probe connector 56 which includes a finger-like extension or flange extending upwardly and outwardly away from the signal probe 34 towards the ground probe assembly 76. In this embodiment the ground probe is first placed in position to contact the desired test point and secondly the signal probe is moved into position to contact the desired test site such that the finger-like projection of the ground shield extender 70 make contact with the ground spring 74. The ground spring is flexible to accommodate bending as the ground shield extender makes contact. In this configuration the ground shield extender is rigid.

Figure 4A:
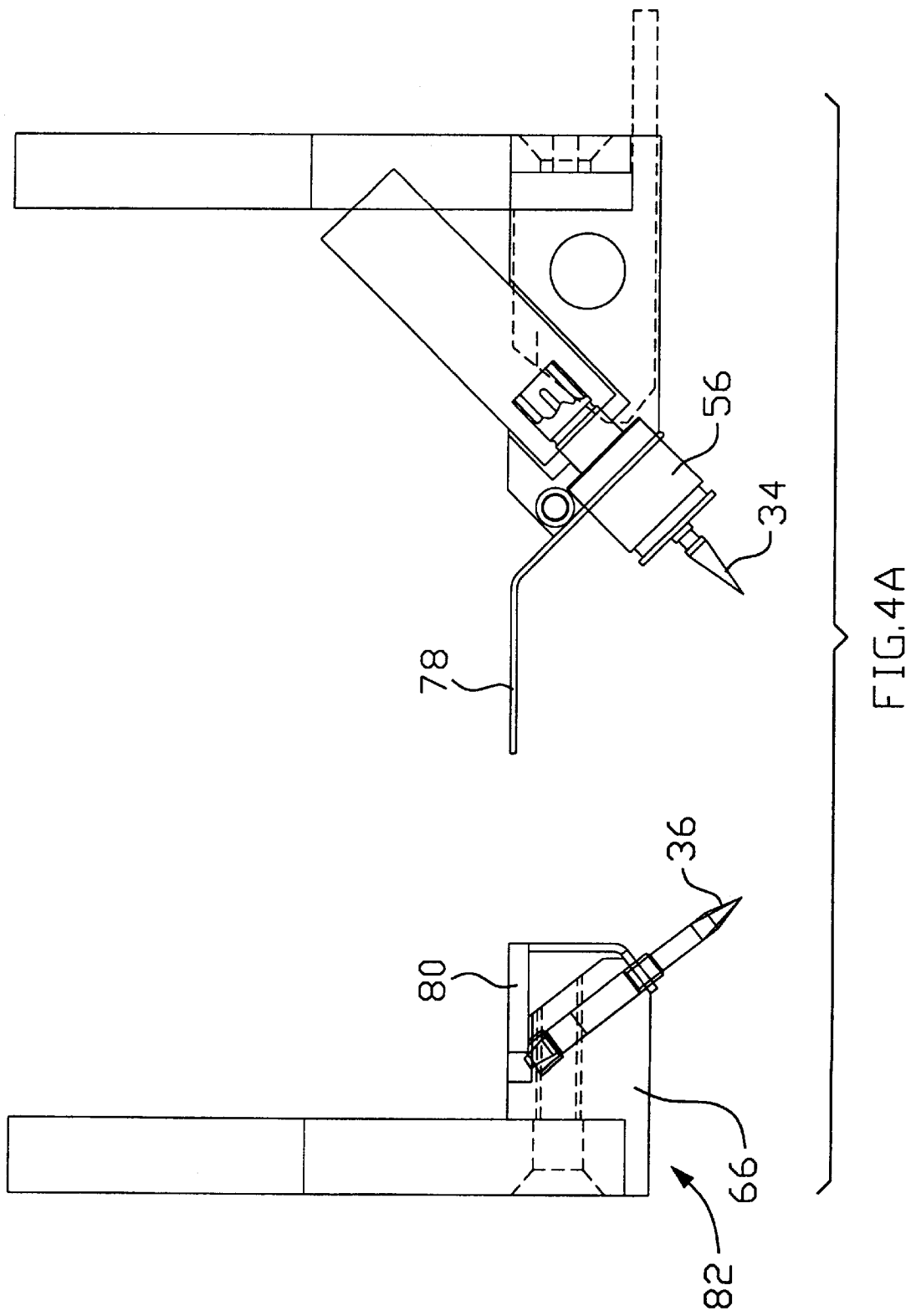
FIG. 4A is a third alternative embodiment of the signal probe and ground probe arrangement of the present invention.
Figure 4B:
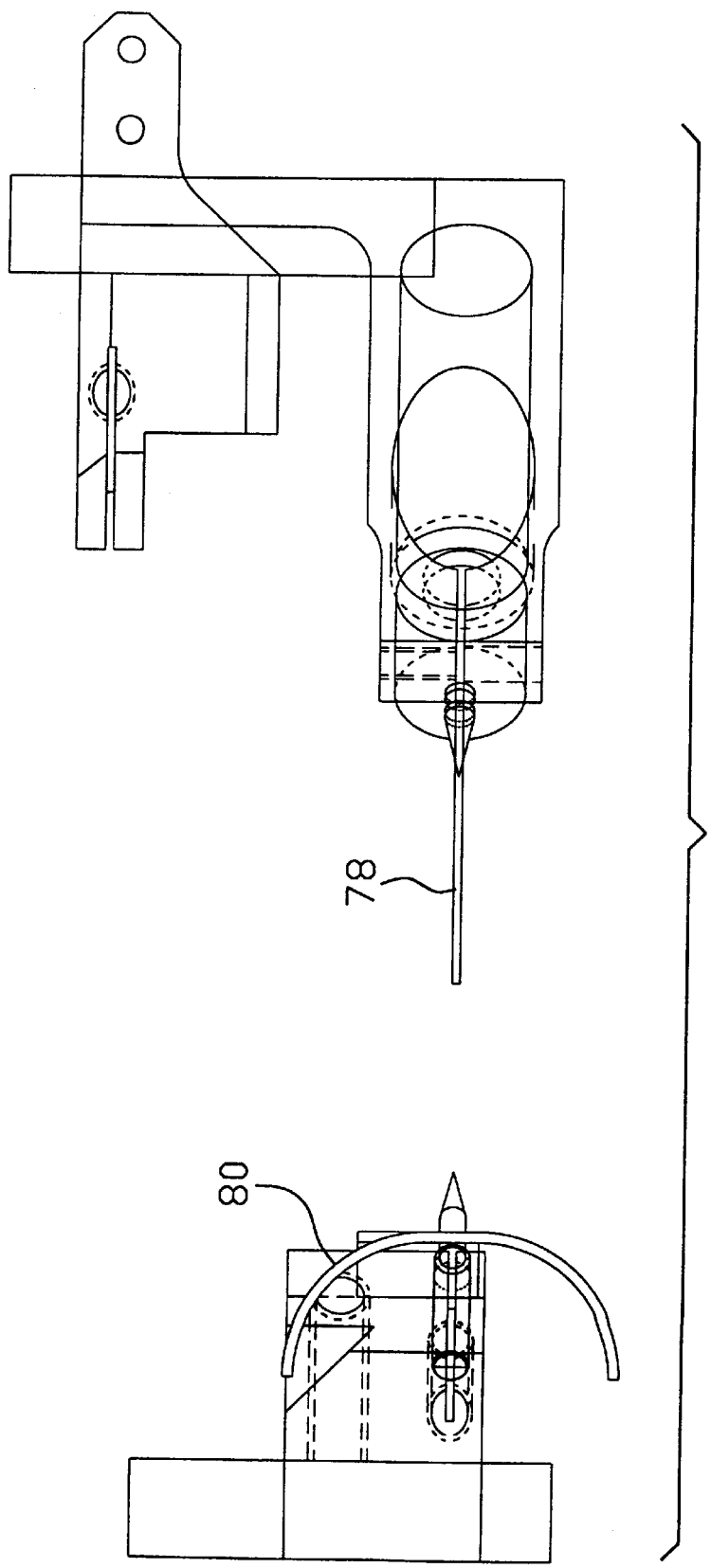
FIG. 4B is a top view of the signal probe and ground probe of FIG. 4A.

FIGS. 4A and 4B show a third alternative embodiment for the ground shield extender 78 and the ground spring 80. In this embodiment the ground shield extender 78 is a flexible wire spring positioned around the signal probe connector 56 which extends upwardly and outwardly away from the signal probe 34 towards the ground probe assembly 82. The ground spring is a curved rigid bar fastened to the ground probe housing 66 and electrically connected to the ground probe 36. In operation the ground probe is moved into contact with the test site and then the signal probe is moved into position with the test site such that the flexible ground shield extender comes into contact with the ground spring. In this embodiment the ground spring is a rigid bar and the ground shield extender is flexible.

Figure 5:
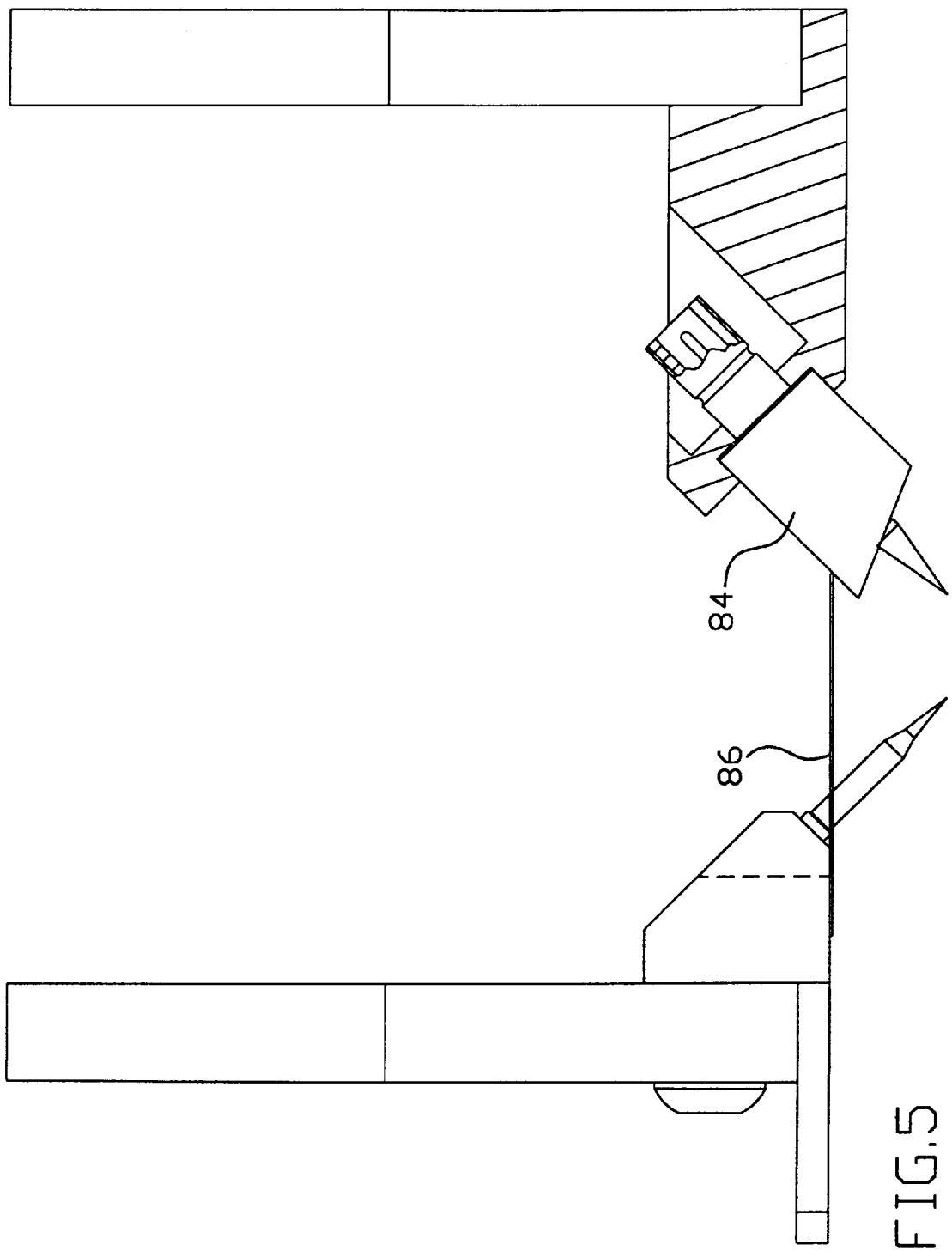
FIG. 5 is a fourth alternative embodiment of the signal probe and ground probe arrangement of the present invention.

FIG. 5 illustrates a fourth alternative embodiment arrangement for the ground shield extender 84 and the ground spring 86. In this embodiment the ground shield extender is a tubular metal band extending around the signal probe connector. The ground spring is a cantilevered spring loop fastened to the ground probe housing. FIG. 6 shows a fifth alternative embodiment for the ground shield extender 88 and the ground spring 90. In this embodiment, the ground shield extender is a bracket 92 positioned around the spring probe connector 56 and extending upwardly away from the signal probe terminating in a mount location 94 for a conventional spring probe 96. The ground spring 90 is a vertical wall extending from the ground probe 36 and ground probe housing 66. The ground spring 90 is rigid to provide sufficient resistance to compress spring probe 96 when the spring probe 36 and the signal probe 34 are moved to their test site locations.

In all of the embodiments, the ground signal is translated through the ground probe into the ground spring, then into the ground shield extender to the ground shield in the test cable to the TDR itself. The test signal moves from the test site through the signal probe into the signal wire in the test cable to the TDR. The signal probe and the ground probe are moved in the desired x, y and z directions by the prober heads of the x-y prober.

Although the present invention has been described and is illustrated with respect to various embodiments thereof, it is to be understood that it is not to be so limited, since changes and modifications may be made therein which are within the full intended scope of this invention as hereinafter claimed.

What is claimed is:

1. A printed circuit board tester for testing matched impedance test sites on a printed circuit board comprising:
    a printed circuit board platform for receipt of the printed circuit board;
    a first test head movable in x, y and z directions positioned over the platform;
    a second test head movable in x, y and z directions positioned over the platform;
    a signal probe attached to one of the first or second test heads;
    a test cable including a signal wire electrically connected to the signal probe and a ground shield for transmitting test signals to a time domain reflectometer;
    a ground shield extender electrically connected to the ground shield of the tester cable positioned around the signal probe; and
    a ground probe attached to the other of the first or second test heads having means for transmitting ground signals to the ground shield extender.

2. The tester of claim 1 wherein the ground shield extender is a compliant metal band.

3. The tester of claim 1 wherein the ground shield extender is a flexible wire spring.

4. The tester of claim 1 wherein the ground shield extender is a flexible cylindrical housing positioned around the signal probe.

5. The tester of claim 1 wherein the means for transmitting ground signals to the ground shield extender includes a ground spring electrically connected to the ground probe.

6. The tester of claim 5 wherein the ground spring is integrally formed with the ground probe.

7. The tester of claim 5 wherein the ground shield extender includes a rigid finger element for depressing the ground spring.

8. The tester of claim 5 wherein the ground spring is a rigid bar.

9. The tester of claim 5 wherein the ground spring is a cantilevered spring loop.

10. The tester of claim 1 wherein the ground shield extender is a spring probe.

11. The tester of claim 10 wherein the means for transmitting ground signals to the ground shield extender is a rigid vertical wall.

12. A circuit board tester comprising:

a x-y prober having two prober heads;

a time domain reflectometer;

a tester cable having a signal wire and a ground shield for transmitting test signals and ground signals from a printed circuit board positioned on the x-y prober to the time domain reflectometer;

a shield member electrically connected to the ground shield of the tester cable which is coupled to a signal probe positioned on a first prober head, the signal probe is electrically connected to the signal wire of the tester cable;

a ground probe positioned on a second prober head variably positionable relative to the signal probe having means for temporarily contacting the shield member to transmit ground signals to the ground shield.

13. The tester of claim 12 wherein the shield member is a compliant metal band.

14. The tester of claim 12 wherein the means for transmitting ground signals to the ground shield member includes a ground spring electrically connected to the ground probe.

15. The tester of claim 14 wherein the ground spring is integrally formed with the ground probe.

16. The tester of claim 14 wherein the shield member includes a rigid finger element for depressing the ground spring.

17. The tester of claim 14 wherein the shield member is a flexible wire spring.

18. The tester of claim 17 wherein the ground spring is a rigid bar.

19. The tester of claim 14 wherein the shield member is a flexible cylindrical housing positioned around the signal probe.

20. The tester of claim 19 wherein the ground spring is a cantilevered spring loop.

21. The tester of claim 12 wherein the shield member is a spring probe.

22. The tester of claim 21 wherein the means for transmitting ground signals to the ground shield extender is a rigid vertical wall.

* * * * *

UNITED STATES PATENT AND TRADEMARK OFFICE
CERTIFICATE OF CORRECTION

PATENT NO. : 6,051,978
DATED : April 18, 2000
INVENTOR(S) : Mark A. Swart

Page 1 of 1

It is certified that error appears in the above-identified patent and that said Letters Patent is hereby corrected as shown below:

Column 6,
Line 2, after "shield" delete "member".

Signed and Sealed this

Eighteenth Day of December, 2001

Attest:

Attesting Officer

JAMES E. ROGAN
Director of the United States Patent and Trademark Office